United States Patent [19]

Rush

[11] Patent Number: 5,723,906
[45] Date of Patent: Mar. 3, 1998

[54] HIGH-DENSITY WIREBOND CHIP INTERCONNECT FOR MULTI-CHIP MODULES

[75] Inventor: Kenneth Rush, Colorado Springs, Colo.

[73] Assignee: Hewlett-Packard Company, Palo Alto, Calif.

[21] Appl. No.: 657,582

[22] Filed: Jun. 7, 1996

[51] Int. Cl.[6] .......................... H01L 23/16; H01L 27/10; H01L 23/48; H01L 23/055
[52] U.S. Cl. .................... 257/723; 257/776; 257/784; 257/692; 257/725; 257/208; 257/203; 257/698
[58] Field of Search ......................... 257/702, 776, 257/786, 794, 723, 725, 730, 698, 692, 696, 691, 203, 208

[56] References Cited

U.S. PATENT DOCUMENTS

| | | | |
|---|---|---|---|
| 5,084,753 | 1/1992 | Goida et al. | 257/698 |
| 5,248,903 | 9/1993 | Heim | 257/750 |
| 5,257,166 | 10/1993 | Marui et al. | 257/723 |
| 5,269,452 | 12/1993 | Sterczyk | 228/49.2 |
| 5,328,079 | 7/1994 | Mathew et al. | 228/180.5 |
| 5,420,460 | 5/1995 | Massingill | 257/693 |
| 5,444,298 | 8/1995 | Schutz | 257/723 |
| 5,468,999 | 11/1995 | Lin et al. | 257/702 |
| 5,485,037 | 1/1996 | Marrs | 257/713 |
| 5,491,362 | 2/1996 | Hamzehdoost et al. | 257/713 |
| 5,496,967 | 3/1996 | Hashimoto et al. | 257/700 |
| 5,512,765 | 4/1996 | Goverick | 257/700 |
| 5,541,449 | 7/1996 | Crane, Jr. et al. | 257/697 |
| 5,561,592 | 10/1996 | Furutani et al. | 257/713 |

OTHER PUBLICATIONS

Mooney, et al. "A 900 Mb/s Bidirectional Signaling Scheme." IEEE Journal of Solid-State Circuits, vol. 30, No. 12, Dec. 1995, pp. 1538-1543.

Yacoub, et al. "Self-Timed Simultaneous Bidirectional Signalling for IC Systems," 1992 IEEE International Symposium on Circuits and Systems, vol. 6, pp. 2957-2960, May 10-13, 1992.

Primary Examiner—Tom Thomas
Assistant Examiner—Alexander Oscar Williams

[57] ABSTRACT

A multi-chip module including a multi-layer substrate and a patterned metallization layer formed on each layer of the substrate. A multi-tiered cavity is formed with an integrated circuit (IC) mounting surface at the bottom of the multi-tiered cavity. A plurality of ICs are mounted on the IC mounting surface of the cavity. A first set of wire bonds extends from at least one IC to the exposed portions of patterned metallization of at least two tiers of the multi-tiered cavity. A second set of wire bonds extends from the at least one IC to bond pads of an adjacent IC. A third set of wire bonds extends from the at least one IC to bond pads of the adjacent IC such that the third set of wire bonds has a higher loop height than the second set of wire bonds.

15 Claims, 3 Drawing Sheets

HIGH-DENSITY WIREBOND CHIP INTERCONNECT FOR MULTI-CHIP MODULES

BACKGROUND OF THE INVENTION

1. Field of the Invention.

The present invention relates, in general, to multi-chip modules, and, more particularly, to high-density connections between chips in a multi-chip module.

2. Statement of the Problem.

As integrated circuits processing technology improves, an increasing number of devices and functions can be integrated onto a single chip. However, this creates a need for increasing numbers of electrical connections to the integrated circuit. Today, the most common method of making the electrical connection between the IC and the package is by wire bonding. Wire bonds are located at the perimeter of the IC at a minimal pitch limited by the state of the art wire bonding machinery. Electrical connections made inside the IC can be formed at much smaller geometries than are supported by the wire bonding machinery. Hence, the number of wire bonds available at the chip perimeter has not kept pace with the increasing demand for electrical connections created by the improvements in semiconductor processing. A need exists for improvements in wire bonding technology that will keep pace with the need for electrical connections.

Proposed solutions include making larger chip perimeters to support a larger number of interconnects. However, this is not an efficient use of silicon and results in increased costs that are usually unacceptable. Other proposals suggest using bond pads distributed throughout the body of the IC. However, practical technologies for making reliable interconnections to the chip interior are uncommon. Some improvement is achieved by staggering two rows of bond pads on the IC. Wire bonds can be made between the two rows of bond pads to non-planar (i.e., multilevel) bond pads on a supporting substrate. This staggered bond pad method effectively doubles the number of wire bonds that can be made between a chip and an external package or leadframe.

Making interconnections between integrated circuits is a particular problem in multi-chip modules where space is at a premium and the need for wide bandwidth electrical connections between chips is great. This is even more true in "scaleable" technologies that provide increased performance by providing arrays of similar type integrated circuits. Examples of scaleable technologies include programmable logic devices such as memories, programmable gate arrays (PGAs), programmable logic arrays (PLAs), field programmable gate arrays (FPGAs), and the like.

In multi-chip designs, a plurality of chips are mounted on a common substrate. The substrate has printed wiring channels and bond pads. Wire bonds are made from each chip to a bond pad on the substrate. The printed wiring channels are used to connect each wire bond to a desired wire bond on another chip. Conventional substrate processes, however, create bond pads at a much lower density than can be formed on the IC. Hence, the chip-to-chip wiring density is limited by the substrate technology. Chips are spaced farther apart to allow the wire bonds to fan out to bond pads formed on the substrate. This increases size of the overall package and increases the physical length of each connection, thereby increasing parasitic capacitance and inductance that limit the speed at which signals can be propagated from chip-to-chip.

Some commercial MCM devices are available with wire bonds formed directly from one chip bond pad to an adjacent chip bond pad. These designs eliminate the effects of intervening substrate bonds. However, until now, direct chip-to-chip bonding has not been able to take advantage of the increased density of staggered bond pads.

Other proposed solutions expand the data carrying capacity of each wire. For example, G. Y. Yacoub et al. propose in a paper entitled "Self-Timed Simultaneous Bi-directional Signaling for IC Systems" (IEEE 1992) that three voltage levels can be used to enable bi-directional data transfer over a single wire. A similar approach is discussed by Mooney et al. in "A 900 Mb/s Bi-directional Signaling Scheme" appearing in the *IEEE Journal of Solid-State Circuits* Vol. 30, No 12 (December, 1995). These systems require high tolerance component matching in the integrated circuits and careful matching of resistances between adjacent chips to provide adequate noise margin between the three voltage levels. Other proposed methods include time domain or frequency domain multiplexing techniques, but these increase the complexity of the system.

A significant factor in the success and reliability of any high-density wire bond technology is the separation between wires. Integrated circuits operate at significantly elevated temperatures that expand the wire bonds and may cause two wires bonds to short if they are too close together. Other factors, including physical stress and shock created during manufacture, test, or use may short wire bonds unless sufficient separation is given between the wires. The prior wire bond technologies discussed above separate the wires in one dimension by controlling pitch of the bond pads. Prior high-density wire bond technology separates the wire bonds in three dimensions by using multiple rows of staggered bond pads coupled to a multi-tiered substrate. The three dimensional separation required the multi-tiered substrate to provide the third dimension of separation. Hence, these prior techniques do not enable chip-to-chip wire bonding where both chips are coplanar and therefore without the benefit of a multi-tiered substrate.

These prior attempts to increase the number of wires and the data capacity of wires in an integrated circuit have not been able to satisfy the need for higher density wire bond connections demanded by state-of-the-art integrated circuits. A need exists for increasing the number of interconnect wires coupled to an integrated circuit and particularly to integrated circuits in multi-chip modules to carry increasing amounts of data between chips.

SUMMARY OF THE INVENTION

Briefly stated, the present invention involves a multi-chip module including a multi-layer substrate and a patterned metallization layer formed on each layer of the substrate. A multi-tiered cavity is formed with an integrated circuit (IC) mounting surface at the bottom of the multi-tiered cavity. A plurality of ICs are mounted on the IC mounting surface of the cavity. A first set of wire bonds extends from at least one IC to the exposed portions of patterned metallization of at least two tiers of the multi-tiered cavity. A second set of wire bonds extends from the at least one IC to bond pads of an adjacent IC. A third set of wire bonds extends from the at least one IC to bond pads of the adjacent IC such that the third set of wire bonds has a higher loop height than the second set of wire bonds.

DETAILED DESCRIPTION OF THE DRAWING

1. Overview

The present invention involves a wire bonding technology providing ultra-high density wire bond connections between two integrated circuits. While the present invention in practice takes advantage of printing, photolithography, and wire bond equipment improvements, the inventive concepts can be applied to any technology to improve wire bond density for that technology. Hence, the specific dimensions, bond pad pitches, wire sizes, and the like are provided for example and understanding only, and are not a limitation on the teachings of the present invention.

Figure 1:
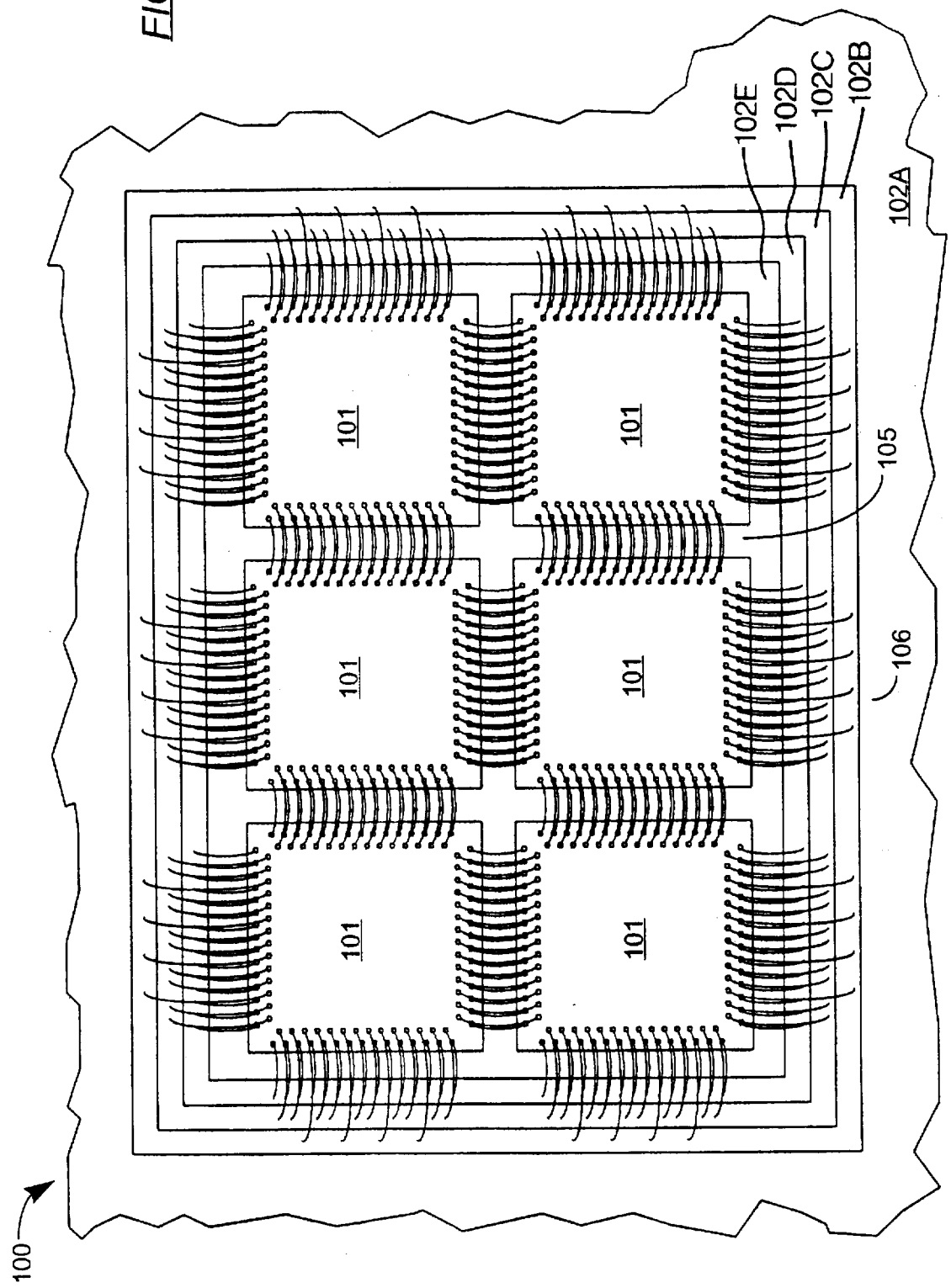
FIG. 1 shows a plan view of a portion of a multi-chip module in accordance with the present invention.
Figure 2:
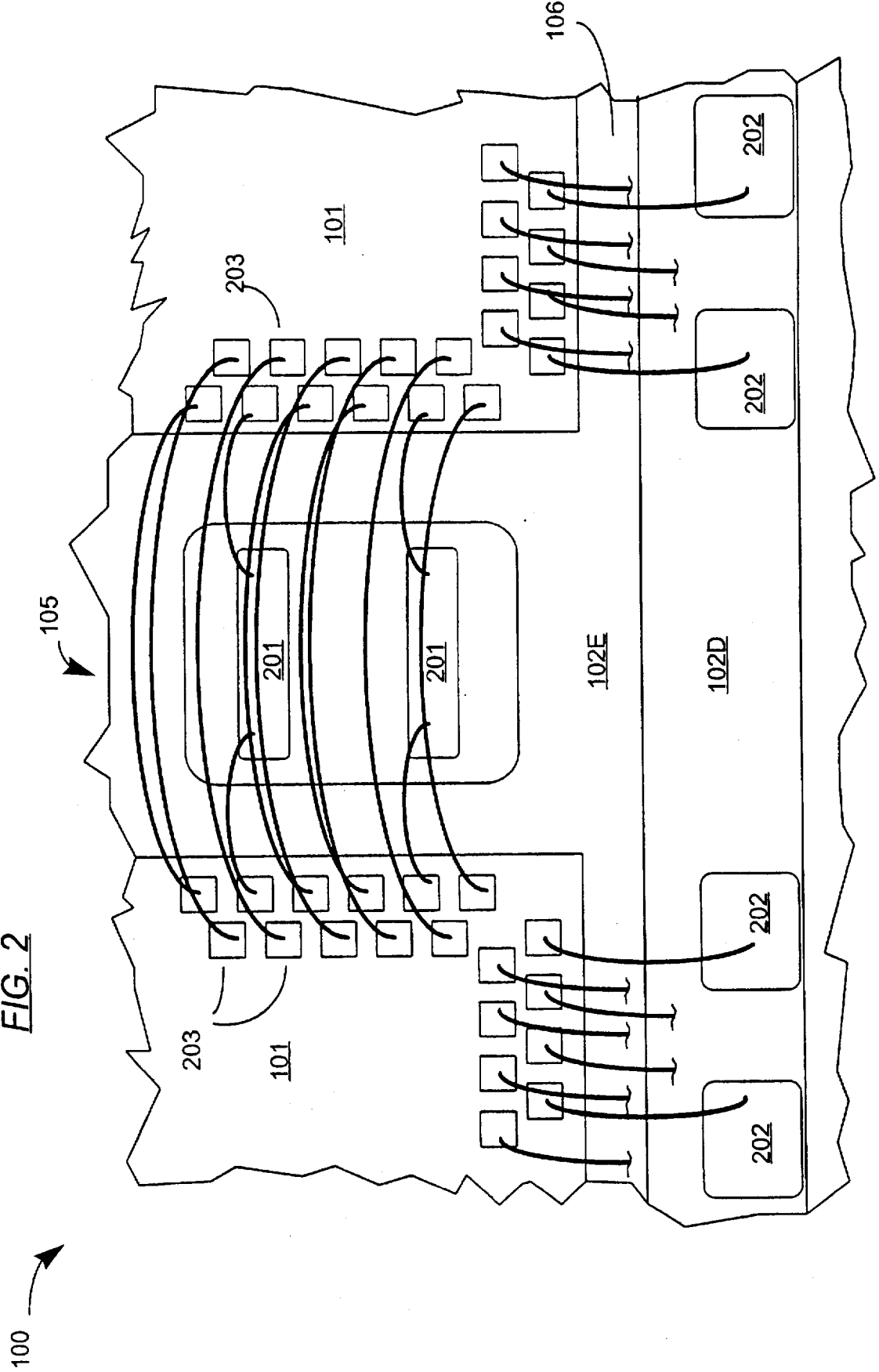
FIG. 2 shows an enlarged section of the multi-chip module shown in FIG. 1.
Figure 3:
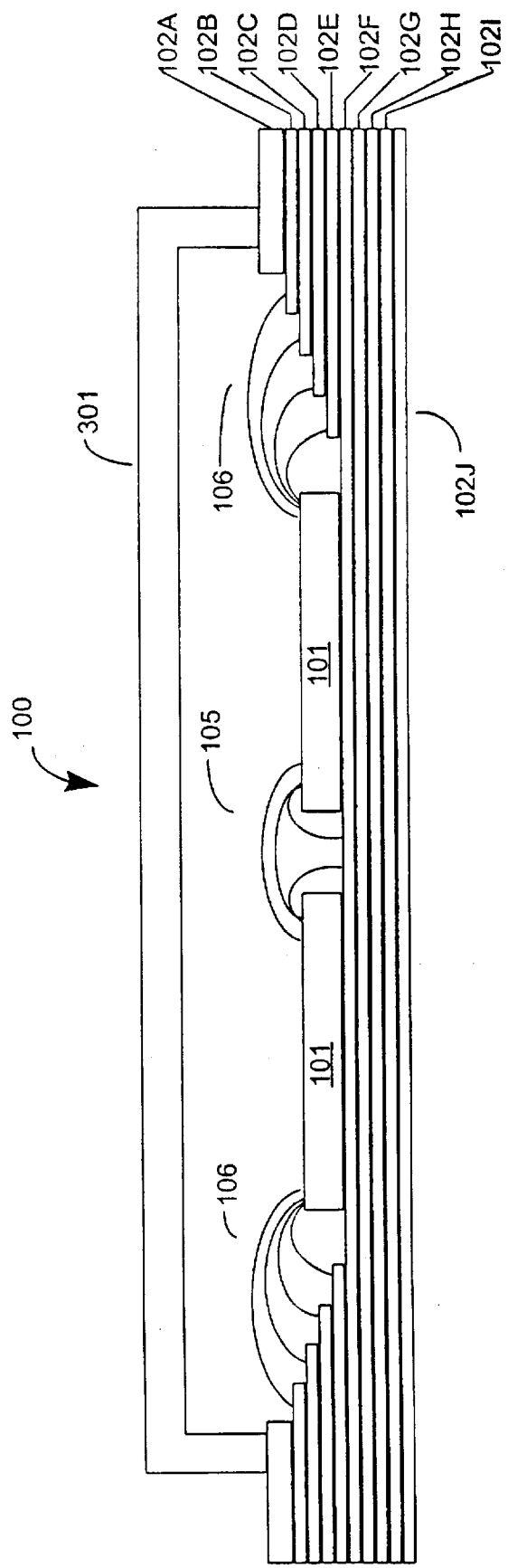
FIG. 3 shows a simplified cross section through a portion of a multi-chip module in accordance with the present invention.

The present invention is used in multi-chip modules (MCMs) such as module 100 shown in FIG. 1. MCMs require high wire density to couple signals between ICs 101 mounted on a common substrate comprising multiple layers 102A–102E (in addition to layers 102F–102J shown in FIG. 3). It should be understood that any number of layers can be used to accommodate a particular manufacturing technology and wiring density required by a design. In the example shown in FIG. 1–FIG. 3, conventional multilevel ceramic substrate technology is used, but any equivalent technology may be employed. In FIG. 1–FIG. 3, each of layers 102A–102J comprise an insulated ceramic material with a patterned metallization layer formed thereon. A portion of each of layers 102A–102D is removed to create a multi-tiered cavity wherein a portion of the patterned metallization on each layer 102B–102E is exposed at the periphery of the cavity. The exposed portion of layer 102E forms a chip mounting surface and is substantially covered by ground plane metallization to which ICs 101 are mounted by conductive epoxy, solder, or a similar chip mounting technology. As discussed below, other patterned metallization features are formed on layer 102E between ICs 101.

Each of layers 102D–102B preferably include signal wiring that carries digital or analog data signals from the ICs 101 to MCM input/output (I/O) pins or terminals (not shown). Layer 102A is a front surface that provides chemical, mechanical, and electrical protection to the underlying layers and serves as mounting surface for a package cap 301 (shown in FIG. 3). Any available MCM technology can be used to form the printed wiring on layers 102B–102D and to form the I/O pins or terminals to enable MCM 100 to be coupled to external circuitry. Wire bonds 106 couple bond pads formed on one edge of each IC 101 to selected conductors or bond pads on layers 102B–102D. Wire bonds 105 couple a bond pad on one IC 101 to a bond pad on an adjacent IC 101. An important feature of the present invention is that each IC 101 comprises multiple rows of bond pads 203 and that wire bonds 105 are coupled to each of the multiple rows. Hence, the present invention achieves the advantages of higher density wiring provided by staggered bond pads 203 as well as the advantages of direct chip-to-chip wire bonds 105.

One feature of the present invention is that chip-to-substrate wire bonds are available but are minimally relied on in favor of direct chip-to-chip wire bonds 105. This allows the wire bond density to be dictated by the pitch at which on-chip bond pads can be formed (as well as the wire bond tool limitations). Hence, the technical limitations inherent in forming bond pads 202 on substrates or lead-frames is not a limitation on the wire bond pitch in accordance with the present invention.

Another feature of the present invention is to use staggered bond pads in a manner that eases the chip-to-chip wire bonds described above. Although staggered bond pads have been used to increase bond pad density, they have not been employed in a three-dimensional wire bonding structure that staggers the wire bond 105 loop heights and loop lengths along with the bond pad 203 staggering. This feature increases wire bond 105 density for a given wire bond tool without sacrificing reliability.

In a particular example, an MCM was manufactured having two tiers of aluminum alloy wire bonds between coplanar chips with an-effective bond pitch of 62.5 microns. Each chip included two rows of bond pads for chip-to-chip bonding. Each MCM included over 1000 chip-to-chip wires with better than 10 parts-per-million defect density.

The present invention is described in terms of a specific example using ultrasonic wire bond technology on a Hughes wire bond tool. The teachings of the present invention find utility on any wire bond tool using any known wire metal or alloy. It is contemplated that improvements in wire bond tool capability will further wire bond capability, and these improved tools will also be able to benefit from the advantages of the present invention. These and other predictable modifications of the teachings in accordance with the present invent ion are equivalent to the apparatus and method in accordance with the present invention.

2. Three Dimensional Wire Bond Separation

A significant factor in the success and reliability of any high-density wire bond technology is the separation between wires. Integrated circuits operate at significantly elevated temperatures that expand the wire bonds and may cause two wires bonds to short if they are too close together. Other factors, including physical stress and shock created during manufacture, test, or use may short wire bonds unless sufficient separation is given between the wires. Most wire bond technology separates the wires in one dimension by controlling pitch of the bond pads to meet the limitations of the wire bond tool. Prior high-density wire bond technology separates the wire bonds in three dimensions by using multiple rows of staggered bond pads coupled to a multi-tiered substrate. As set out hereinbefore, these techniques are not applicable to chip-to-chip wire bonding where both chips are coplanar and therefore without the benefit of a multi-tiered substrate.

FIG. 2 shows an enlarged portion of MCM 100 of FIG. 1. Adjacent ICs 101 are mounted to mounting surface 102E at the base of a cavity formed in a multi-layer substrate. Layer 102D is elevated above layer 102E and includes bond pads 202 used to couple signals to external circuitry in a conventional manner. Between bond pads 203 of adjacent ICs 101, three tiers of wiring are formed by wire bonds 105.

In a preferred embodiment, bond pads 201 are formed on the surface of layer 102E and are coupled by vias to power supply voltages distributed on the patterned metallization of layers 102F–102J (shown in FIG. 3). Fewer or more power supply voltages may be required thereby requiring correspondingly fewer or more layers in the multi-layer substrate. Also, bond pads 201 may be coupled to digital or analog signals instead of power supply lines.

A first tier of chip-to-chip wire bonds 105 is formed by connections between selected ones of the outermost row of bond pads 203 to bond pads 201 on substrate layer 102E. In FIG. 2, every sixth bond pad 203 is coupled to a bond pad 201. The number of necessary connections will depend on the number of power supply voltages required by circuitry on ICs 101 as well as the desired level of power supply integrity required by the circuitry on ICs 101. This first set of wire bonds 105 formed between bond pads 203 and bond pads 201 is formed in a conventional manner using available technology for making chip-to-substrate wire bonds.

A second tier of chip-to-chip wire bonds 105 is formed by connections between the remaining ones of bond pads 203 in the outermost row to the bond pads 203 of the adjacent IC 101. Preferably ICs 101 are aligned to each other such that bond pads 203 on each IC 101 align to corresponding bond pads 203 on the adjacent IC 101. Desirably all of the bond pads 203 in the outermost row on each IC 203 are coupled either in the first tier or the second tier of chip-to-chip wire bonds 105, however, it is acceptable to leave some bond pads 203 unattached if they are not used, not needed, or are defective. This second set of wire bonds 105 has a higher loop height (i.e., the maximum height of the wire as it spans the two chips) than does the first tier of wire bonds 105. This difference in loop height is caused primarily because each of the second tier of wires has a longer length than does the first tier of wire bonds 105. Because the first tier of wire bonds 105 are physically spaced from the second tier of wire bonds by a the pitch of bond pads 203, it is not critical that loop height of the second tier be substantially greater than the first tier.

A third tier of chip-to-chip wire bonds 105 is formed by connections between bond pads 203 in the inner row of each IC 101 to bond pads 203 formed on the inner row of the adjacent IC 101. Preferably, the inner row of bond pads 203 on each IC 101 is staggered or offset with respect to the outer row of bond pads 203 which gives some degree of spacing between the third tier wire bonds 105 and the first and second tier wire bonds 105. In order to provide a further degree of spacing, the loop height of the third tier of chip-to-chip wire bonds 105 is set higher that either the first tier or second tier of wire bonds 105. This is most visible in FIG. 3 which shows the significant spacing between the second tier of wire bonds 105 from the third tier wire bonds 105.

In accordance with the present invention, chip-to-chip wire bonds 105 are offset from each other in two dimensions as shown in FIG. 2 and in a third dimension shown in FIG. 3 to yield sufficient spacing between wires for a rugged high-yield high density chip-to-chip wire bond. Using available wire bond tools, hundreds of wire bonds can be formed on each side of a typically sized IC 101.

It should be understood that the present invention takes advantage of spacing provided by both staggered bond pads 203 and staggered loop heights in wire bonds 105. Neither of these techniques are used alone in chip-to-chip wire bonds, and each by themselves provides some degree of spacing between wire bonds 105 that couple between coplanar bond pads 203 on adjacent chips. However, it is believed that the best technique for using the present invention is to combine both staggered bond pads 203 and staggered loop heights rather than using either technique by itself.

3. Multilevel Substrate Construction

Although construction of multi-layer substrate having layers 102A–102E is largely conventional, the use of interchip bond pads 201 (shown in FIG. 2) allows formation of the first tier of wire bonds 105 that provide power and ground to ICs 101. Because large ICs need many connections to power and ground supplies for stable operation, it is necessary to place power and ground bond pads 201 between adjacent ICs 101 so that each bond pad 201 is accessible by two ICs 101. As shown in FIG. 3, each of lower substrate layers 102F–102J are available for carrying power supply voltages that can be coupled to the surface of layer 102E to bond pads 201. The metallization of layer 102E is patterned to provide bond pads 201 over vias or throughholes that couple to the underlying power supply voltages on layers 102F–102J. Any of layers 102F–102J may carry digital or analog signals instead of or in addition to power supply voltages. In a specific implementation one of layers 102F–102J is used to couple bond pads 203 at one end of MCM 100 (i.e., the left side in FIG. 1) to bond pads 203 on the opposite end of MCM 100 (i.e., the right side in FIG. 1). This type of connection is primarily useful in an array of programmable logic such as when each of ICs 101 is an FPGA or similar type circuit.

4. Chip Layout

In the preferred implementation ICs 101 are substantially identical to reduce cost of MCM 100. Each MCM 100 has a first side that has bond pads that support communication with external circuitry through wire bonds 106. The remaining three sides of each IC 101 have two rows of bond pads that support chip-to-chip wire bonds 105. ICs 101 are arranged in two rows of any length (or two columns of any length). ICs 101 are positioned such that the first side faces outward so that wire bonds 106 are parallel and couple to substrate layers 102B–102D on two opposed sides of MCM 100. Hence, each IC 101 has three sides that support chip-to-chip communication and so enable the chips to be placed in a 2×N array where N is any number limited by the substrate size and practical cost and manufacturing considerations.

This preferred layout of IC 101 results in two opposite sides of MCM 100 to have chip-to-chip bond pads 203 rather than bond pads that support wire bonds 106. In this case, it is advantageous to use one or more of layers 102B–102J to couple bond pads 203 on these opposed ends of MCM 100. This interconnection is called a "wrap around" and is optionally available to provide chip-to-chip connections for non-adjacent ICs 101. In this manner, chip-to-chip wire bonds 105 can be used to couple the signal lines between any number of ICs 101. It should be understood that the particular implementation illustrated for the present invention is an example only and is not a limitation on the high-density chip-to-chip wire bond feature of the present invention.

5. Wire Bonding Method

Because chip-to-chip wire bonds 105 in accordance with the present invention are formed in three dimensions with varying wire bond lengths, loop heights, and position, the wire bond processes desirably proceeds in an orderly fashion described herein. In the preferred method, three passes are made on each side of each IC 101 with an evaluation following each pass. By electrically and/or visually inspecting the wire bonds at the end of each pass, some defective wire bonds 105 and 106 can be repaired before they are covered by a subsequent layer of wiring. Because a single MCM in accordance with the present invention may easily have thousands of wire bonds 105 and 106, even a low background level of defects will result in some defective wire bonds 105 or 106 after assembly.

Preferably, power supply and ground supply connections are provided through substrate bond pads 201 (shown in FIG. 2) as described above. A first level of wire bonds are formed by coupling selected bond pads 203 of each IC 101 to appropriate bond pads 201 on substrate layer 102E. In most cases this will mean that many bond pads are left open or unused after the first pass. The power and ground wire bonds have the smallest loop height and loop length, hence are made first. Also, the power and ground connections can be electrically inspected after the first pass to allow identification and repair of any defective wire bonds.

In a second pass, the second tier of chip-to-chip wire bonds 105 are formed having loop heights slightly greater than the first tier wire bonds 105 and physically spaced from the first tier wire bonds by the pitch of bond pads 203. Preferably a visual and/or electrical inspection is performed after the second pass, although electrical inspection may be impossible until the remaining wire bonds are formed A third pass is made to form the third tier wire bonds 105 having a loop height greater than formed during the forming of the second wire bonds or the first wire bonds.

By now it is appreciated that a high-density wire bond chip interconnect for multi-chip modules is provided that increases wiring density by staggering wire bonds in three dimensions between two substantially planar surfaces on adjacent ICs. The details of the specific examples illustrated and described in accordance with the preferred embodiments are provided for completeness only, and are not considered limitations on the teachings of the present invention. Accordingly, the many modifications of the specific implementation including the modifications expressly suggested herein are equivalent to the preferred embodiments described herein.

I claim:

1. A multi-chip module comprising:
    a substrate having an die mounting surface formed thereon;
    patterned metallization formed on the die mounting surface of the substrate to provide a plurality of ground conductors and a plurality of power supply conductors;
    a first integrated circuit (IC) mounted to the patterned metallization of the die mounting surface;
    a first row of bond pads formed on an upper surface periphery of the first IC;
    a second row of bond pads formed on the upper surface periphery of the first IC and inside the first row of bond pads;
    a second IC mounted to the die mounting surface;
    a third row of bond pads formed on an upper surface periphery of the second IC;
    a fourth row of bond pads formed on the upper surface periphery of the second IC and inside the third row of bond pads;
    a first set of wire bonds above the substrate coupling the second row of bond pads to the fourth row of bond pads;
    a second set of wire bonds above the substrate coupling selected ones of the first row of bond pads to selected ones of the third row of bond pads;
    a third set of wire bonds above the substrate exclusive of the second set of wire bonds coupling selected ones of the first row of bond pads to the patterned metallization formed on the substrate; and
    a fourth set of wire bonds above the substrate exclusive of the second set of wire bonds coupling selected ones of the third row of bond pads to the patterned metallization formed on the substrate.

2. The multi-chip module of claim 1 wherein the first, second, third, and fourth rows of bond pads are substantially coplanar.

3. The multi-chip module of claim 1 wherein the first set of wire bonds has a loop height greater than the second set of wire bonds.

4. The multi-chip module of claim 1 wherein the first set of wire bonds has a loop height greater than both the second set of wire bonds and the third set of wire bonds.

5. The multi-chip module of claim 1 wherein the first row of bond pads is staggered from the second row of bond pads and the third row of bond pads is staggered from the fourth row of bond pads.

6. A multi-chip module comprising:
    a multi-layer substrate;
    a patterned metallization layer formed on each layer of the substrate;
    a multi-tiered cavity formed in the substrate by removing portions of less than all of the layers of the multi-layer substrate, wherein each tier exposes a portion of the patterned metallization layer on a single layer of the substrate;
    an integrated circuit (IC) mounting surface at the bottom of the multi-tiered cavity;
    a plurality of ICs mounted on the IC mounting surface of the cavity;
    a first set of wire bonds extending from at least one IC to the exposed portions of patterned metallization of at least two tiers of the multi-tiered cavity;
    a second set of wire bonds extending from the at least one IC to bond pads of an adjacent IC; and a third set of wire bonds extending from the at least one IC to bond pads of the adjacent IC wherein the third set of wire bonds has a higher loop height than the second set of wire bonds thereby allowing the third set to clear the second set.

7. The multi-chip module of claim 6 wherein the first set of wire bonds comprises:
    a first wire bond extending from at least one IC to bond pads exposed in the patterned metallization of a first tier of the multi-tiered cavity;
    a second wire bond extending from the at least one IC to bond pads exposed in the patterned metallization of a second tier of the multi-tiered cavity;
    a third wire bond extending from the at least one IC to bond pads exposed in the patterned metallization of a third tier of the multi-tiered cavity; and
    a fourth wire bond extending from the a least one IC to bond pads of a fourth tier of the multi-tiered cavity.

8. The multi-chip module of claim 6 wherein the second and third sets of wire bonds are on the same side of the at least one IC.

9. The multi-chip module of claim 6 wherein each of the third set of wire bonds is longer than each of the second set of wire bonds.

10. An electronic circuit comprising:
    a plurality of integrated circuits (ICs) having four edges and each further including:
        (a) external input/output circuitry formed on a first edge of the IC;
        (b) a first type of inter-chip I/O circuitry formed on a second edge opposite of the first edge of the IC;
        (c) a second type of inter-chip I/O circuitry formed on third and fourth edges of the IC; and
    a substrate mounted to each of the plurality of integrated circuits such that the first type of inter-chip I/O on each of the plurality of ICs faces the first type of inter-chip I/O of an adjacent one of the plurality of ICs and at least one of the second type of inter-chip I/O faces the second type of inter-chip I/O of an adjacent IC.

11. The electronic circuit of claim 10 wherein the first type of inter-chip I/O circuitry further comprises:

a first row of bond pads formed on the second edge of the IC and coupled to internal circuitry on the IC;

a second row of bond pads formed on the second edge and inside the first row of bond pads and coupled to internal circuitry on the IC, wherein the second row is staggered with respect to the first row of bond pads;

a first set of wire bonds coupling some of the first row of bond pads of each IC to selected ones of bond pads of an adjacent IC;

a second set of wire bonds coupling each of the second row of bond pads to each of the second row of bond pads of the adjacent IC a first row of bond pads formed on the third edge of the IC and coupled to internal circuitry on the IC;

a second row of bond pads formed on the third edge and inside the first row of bond pads and coupled to internal circuitry on the IC, wherein the second row is staggered with respect to the first row of bond pads;

a third row of bond pads formed on the fourth edge of the IC and coupled to internal circuitry on the IC;

a fourth row of bond pads formed on the fourth edge and inside the third row of bond pads and coupled to internal circuitry on the IC, wherein the fourth row is staggered with respect to the third row of bond pads;

first set of wire bonds coupling some of the first row of bond pads of each IC to selected ones of the third row of bond pads of the adjacent IC; and a second set of wire bonds coupling each of the second row of bond pads to each of the fourth row of bond pads of the adjacent IC.

12. A method for forming for forming wire bonds in a multi-chip module (MCM) comprising the steps of:

providing a substrate having a plurality of ICs mounted thereon such that each IC is adjacent to at least one other IC;

providing printed wiring with printed bond pads on exposed surfaces of the substrate in proximity to edges of the plurality of ICs;

forming first wire bonds above the substrate and between selected locations on at least one of the ICs to the printed bond pads on the substrate;

forming second wire bonds above the substrate and between selected locations on each IC to selected locations on the adjacent ICs;

forming third wire bonds above the substrate and between selected locations on each IC to selected locations on the adjacent ICs wherein the third wire bonds are formed with a larger loop height above the substrate than formed during the forming of the second wire bonds or the first wire bonds.

13. The method of claim 12 wherein the step of forming second wire bonds is performed after the step of forming first wire bond and the step of forming third wire bonds is formed after the step of forming second wire bonds.

14. The method of claim 13 further comprising the steps of:

visually and electrically inspecting the wire bonds before the step of forming the second wire bonds to detect any defective ones of the wire bonds; and repairing at least some of the defective ones of the wire bonds before the step of forming the second wire bonds.

15. The method of claim 14 further comprising the steps of:

inspecting the wire bonds before the step of forming the third wire bonds to detect any defective ones of the wire bonds; and repairing at least some of the defective ones of the wire bonds before the step of forming the third wire bonds.

* * * * *

UNITED STATES PATENT AND TRADEMARK OFFICE
CERTIFICATE OF CORRECTION

PATENT NO.    : 5,723,906
DATED         : June 7, 1996
INVENTOR(S)   : Kenneth Rush It is certified that error appears in the above-identified patent and that said Letters Patent is hereby corrected as shown below:

Title page,
Item [57], ABSTRACT,
Line 1, insert -- a -- before "first"

Signed and Sealed this

Fourth Day of March, 2003

JAMES E. ROGAN
*Director of the United States Patent and Trademark Office*